(12) United States Patent
Jot et al.

(10) Patent No.: US 10,251,016 B2
(45) Date of Patent: Apr. 2, 2019

(54) DIALOG AUDIO SIGNAL BALANCING IN AN OBJECT-BASED AUDIO PROGRAM

(71) Applicant: DTS, Inc., Calabasas, CA (US)

(72) Inventors: Jean-Marc Jot, Aptos, CA (US); Brandon Smith, Kirkland, WA (US); Jeffrey K. Thompson, Bothell, WA (US); Zoran Fejzo, Los Angeles, CA (US)

(73) Assignee: DTS, Inc., Calabasas, CA (US)

( * ) Notice: Subject to any disclaimer, the term of this patent is extended or adjusted under 35 U.S.C. 154(b) by 0 days.

(21) Appl. No.: 15/336,382

(22) Filed: Oct. 27, 2016

(65) Prior Publication Data

US 2017/0127212 A1    May 4, 2017

Related U.S. Application Data

(60) Provisional application No. 62/247,678, filed on Oct. 28, 2015.

(51) Int. Cl.
*H04S 7/00* (2006.01)
*G10L 19/008* (2013.01)
(Continued)

(52) U.S. Cl.
CPC ............ *H04S 7/307* (2013.01); *G10L 19/008* (2013.01); *G10L 19/20* (2013.01);
(Continued)

(58) Field of Classification Search
None
See application file for complete search history.

(56) References Cited

U.S. PATENT DOCUMENTS 6,442,278 B1   8/2002  Vaudrey et al.
7,454,331 B2   11/2008 Vinton et al.
(Continued)

FOREIGN PATENT DOCUMENTS

| WO | WO-2014046923 A1 | 3/2014 |
| WO | WO-2015038475 A1 | 3/2015 |
| WO | WO-2017075249 A1 | 5/2017 |

OTHER PUBLICATIONS

"International Application Serial No. PCT/US2016/059175, International Search Report dated Jan. 25, 2017", 2 pgs.
(Continued)

*Primary Examiner* — James K Mooney
(74) *Attorney, Agent, or Firm* — Schwegman Lundberg & Woessner, P.A.

(57) ABSTRACT

Systems, devices, and methods are described herein for adjusting a relationship between dialog and non-dialog signals in an audio program. In an example, information about a long-term dialog balance for an audio program can be received. The long-term loudness dialog balance can indicate a dialog-to-non-dialog loudness relationship of the audio program. A dialog loudness preference can be received, such as from a user, from a database, or from another source. A desired long-term gain or attenuation can be determined according to a difference between the received long-term dialog balance for the audio program and the received dialog balance preference. The long-term gain or attenuation can be applied to at least one of the dialog signal and the non-dialog signal of the audio program to render an audio program that is enhanced according to the loudness preference.

20 Claims, 11 Drawing Sheets

(51) Int. Cl.
  *G10L 19/20* (2013.01)
  *G10L 21/0324* (2013.01)
  *H03G 3/00* (2006.01)
  *H03G 3/30* (2006.01)
  *H03G 7/00* (2006.01)
  *H04S 3/00* (2006.01)
  *G10L 19/16* (2013.01)

(52) U.S. Cl.
  CPC ......... *G10L 21/0324* (2013.01); *H03G 3/005* (2013.01); *H03G 3/3005* (2013.01); *H03G 3/3089* (2013.01); *H03G 7/002* (2013.01); *H03G 7/007* (2013.01); *H04S 3/008* (2013.01); *H04S 7/308* (2013.01); *G10L 19/167* (2013.01); *H04S 2400/13* (2013.01); *H04S 2420/03* (2013.01)

(56) References Cited

U.S. PATENT DOCUMENTS

| | | | |
|---|---|---|---|
| 8,275,610 B2 | 9/2012 | Fuller et al. | |
| 8,494,840 B2 | 7/2013 | Muesch | |
| 8,577,676 B2 | 11/2013 | Muesch | |
| 2005/0078840 A1* | 4/2005 | Riedl | H03G 7/007 381/104 |
| 2009/0245539 A1* | 10/2009 | Vaudrey | H03G 7/002 381/109 |
| 2010/0046765 A1* | 2/2010 | De Bruijn | H03G 3/001 381/58 |
| 2013/0170672 A1* | 7/2013 | Groeschel | H03G 3/3005 381/119 |
| 2015/0078585 A1* | 3/2015 | Reilly | H03G 7/002 381/107 |
| 2015/0237454 A1 | 8/2015 | Scheirer et al. | |

OTHER PUBLICATIONS

"International Application Serial No. PCT/US2016/059175, Written Opinion dated Jan. 25, 2017", 5 pgs.

"Algorithms to measure audio programme loudness and true-peak audio level", Recommendation ITU-R BS.1770-3, (2012), 1-22.

"ATSC Recommended Practice:Techniques for Establishing and Maintaining Audio Loudness for Digital Television (A/85:2013)", Advanced Television Systems Committee, (Mar. 12, 2013), 1-75.

"Loudness Normalisation and Permitted Maximum Level of Audio Signals", R 128, (Jun. 2014), 5 pgs.

"MDA; Object-Based Audio Immersive Sound Metadata and Bitstream", ETSI TS 103 223 V1.1.1, (Apr. 2015), 1-73.

"Public Law 111-311", 111th Congress, (Dec. 15, 2010), 3294-3285.

Fuchs, Harald, et al., "Dialogue Enhancement—technology and experiments", EBU Technical Review, (2012), 1-11.

Uhle, Christian, et al., "Speech enhancement of movie sound", 125th Convention of the Audio Engineering Society—Convention Paper 7628, (Oct. 2008), 15 pgs.

"International Application Serial No. PCT/US2016/059175, International Preliminary Report on Patentability dated May 11, 2018", 7 pgs.

\* cited by examiner

DIALOG AUDIO SIGNAL BALANCING IN AN OBJECT-BASED AUDIO PROGRAM

CROSS-REFERENCE TO RELATED APPLICATION

This patent application claims the benefit of priority to U.S. Provisional Patent Application No. 62/247,678, filed on Oct. 28, 2015, which is incorporated by reference herein in its entirety.

BACKGROUND

Dialog or commentary can be a critical audio element in a movie soundtrack or in a television broadcast program. During certain passages of a movie, a listener may desire dialog audio to be more prominent than is provided in an original mix of dialog and non-dialog audio signals. More prominent dialog can be desirable to achieve or maintain listening comfort, such as for a listener with hearing loss, for a listener attempting to understand dialog occurring in other than his or her native language, or under adverse listening conditions.

For some genres or types of media content, such as a sports or game broadcast in which dialog audio is a commentary track, a preferred relationship or ratio of a dialog audio level to a non-dialog audio level can vary significantly from person to person. A preferred audio signal relationship for a particular listener can be, for example, an increase or a reduction in dialog salience, or dialog signal amplitude level, such relative to an original mix or broadcast signal mix.

An audio program can include multiple different audio channel signals. For example, in a conventional multichannel digital audio format, such as the 5.1 format, each of multiple different audio channels can be assigned to a respective playback loudspeaker in a prescribed layout. In a conventional system, a given audio channel signal can include a combination of dialog and non-dialog components in the same signal. Dialog detection or classification techniques can be used to selectively process dialog-related components of the signal.

In an object-based digital audio format, each of multiple different audio signals can be provided independently, such as for rendering at or near a playback location. Such an object-based format can provide more flexibility over a traditional multichannel format, and can make it possible to separately store, process, or transmit different components of an audio program.

For example, in an object-based digital audio format, dialog signals can be handled or processed independently from other audio signals. Furthermore, in object-based digital audio, a signal can include or can be associated with an "object type" designation, such as "dialog", "music", "effect", or some other designation. In some examples, an object signal can refer to a stem of an audio program, such as a music stem, an effects stem, or a dialog stem. Each stem can include one or more audio object signals. Object type information can optionally be embedded or included in metadata with an audio object signal itself. At playback, each audio object signal can optionally be analyzed and processed independently, such as before being mixed and rendered to an output.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter in any way.

Various embodiments of dialog control and enhancement systems and methods described herein are configured to use object-based digital audio coding formats. These formats, which are suitable for digital audio/video broadcast or streaming services and other applications, can include or use dialog "tracks", or objects, that represent audio signals that are transmitted separately from non-dialog elements of the same audio program. Such objects can include or use signal loudness metadata and can be gain-corrected selectively at a receiving end.

Various embodiments of the systems and methods provide dialog control in which modification of the original audio content material or dynamic gain adjustment can be applied to meet a system or user preference or expectation. This can help avoid a need for a user to adjust dialog control parameters or settings during a program, or when switching between programs. Additionally, embodiments of the systems and methods can be compatible with existing broadcast standards and regulations that ensure consistent program loudness across content genres and sources (e.g., including commercial interruptions), thus avoiding annoyance and minimizing a need for repeated volume adjustment by the user during a program, or when switching between programs.

Embodiments of the systems and methods include an intuitive user parameter interface. This user parameter interface is provided for personalizing the experience to a listener's individual preference such that corrections are applied if a decoder detects that a correction is necessary for a given piece of content. Dialog balance personalization can include applying a fixed gain offset over an entire audio program, such as to adjust a dialog-to-non-dialog balance according to along-term dialog balance metric. Dialog protection techniques can additionally or alternatively be applied to provide a time-varying gain offset, if necessary, such as during audio program portions where a short-term dialog balance metric falls outside of a user-defined preference range. For example, dialog protection can be provided whenever a user's listening comfort is compromised by concurrent elements such as dialog together with sound effects or music.

In an object-based audio system, a decoder or renderer can be configured to receive separate dialog object signals and non-dialog object signals. The decoder or renderer can be configured to apply a gain or attenuation to one or both of dialog and non-dialog object signals. In an example, a decoder can receive an indication of a desired dialog-to-non-dialog salience, or balance, such as corresponding to a particular user, genre, program type, or environment. The desired dialog-to-non-dialog balance can be realized by the decoder, such as by applying gain or attenuation to one or more of the separate objects, that is, independently to a dialog signal and a non-dialog signal.

The present inventors have recognized, among other things, that user preferences can limit a practical usefulness of an adjustable dialog signal balance for consumers. For example, if a control parameter available to a user is a fixed "dialog gain" parameter that represents a dialog gain (or attenuation, such as in the case of a negative gain) applied to all dialog objects or components in any audio material, then a resulting signal modification may be unnecessary or undesirable when the original material already represents a suitable dialog-to-non-dialog balance. That is, in some cases, a suitable dialog-to-non-dialog balance may already exist in a given audio program, and therefore applying a global dialog gain or attenuation can be detrimental to the user's experience. Additionally, song listeners may be compelled to repeatedly adjust the dialog gain parameter when switching between different audio program sources.

Some techniques for maintaining dialog intelligibility use a non-dialog signal that can be automatically attenuated relative to a dialog signal by applying a time-varying attenuation. Such a time-varying attenuation can be calculated to maintain a predetermined level of predicted intelligibility while maximizing a loudness of a non-dialog signal. Since these types of techniques are designed to preserve speech intelligibility, they may not permit a user to apply a user-specified attenuation to the speech or commentary signal relative to a non-speech signal.

Another technique for automatically adjusting a balance between dialog and non-dialog audio signals includes detecting a volume ratio in an input signal and then automatically deriving a gain correction in order to meet a specified volume ratio value. However, both this and the previously described techniques can be susceptible to producing noticeable audio artifacts in the output signal, for example, as a result of real-time gain variations.

The present inventors have recognized that a solution to the above-described problems includes providing or maintaining an audio program having optimally-balanced dialog and non-dialog audio components. In an example, the solution includes or uses an object-based audio reproduction system to realize a user's preferred dialog-to-non-dialog balance, such as for an entire audio program, and for audio programs of different types.

In an example, the solution includes associating each portion or segment of an audio program with a dialog balance metric that indicates a relationship between loudness of dialog and non-dialog signals of an audio program. At playback, the system can be configured to compare the dialog balance metric with a user-specified dialog balance preference value, and can then automatically apply a dialog-to-non-dialog signal balance correction (if necessary) to respective portions of the audio program. In an example, the solution includes associating multiple object signals, or categories of object signals, with one or more loudness metrics or loudness balance metrics.

In an example, the solution includes providing a long-term dialog balance, or salience, for an audio program, such as can be based on loudness metrics of each of multiple audio object signals in the audio program. The long-term dialog balance can generally be associated with an entire duration of an audio program, and in such instances can be considered to be a "global" dialog balance with respect to the audio program. In an example, the long-term dialog balance can be associated with less than an entire audio program and more than a few seconds (e.g., more than about 5-10 seconds) of continuous audio program material.

The solution can include receiving a long-term dialog balance preference, such as can be received from a user or can be based on a known or detected audio program genre (e.g., detected using metadata of a dialog signal and/or of a non-dialog signal). The solution can include rendering or playing an audio program for a particular user, comparing the audio program's long-term dialog balance to the received long-term dialog balance preference for the user, and then correcting a dialog-to-non-dialog signal balance so that the long-term dialog balance for an audio output signal corresponds to the listener's long-term dialog balance preference. In an example, the solution further includes applying a dialog "protection" scheme for a dialog signal. The dialog protection scheme can be configured to ensure that a short-term dialog balance or salience does not fall below a user-defined threshold, such as a threshold beyond which the user's listening comfort is compromised by the occurrence of concurrent audio signal elements like sound effects or music.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

BRIEF DESCRIPTION OF THE DRAWINGS

Referring now to the drawings in which like reference numbers represent corresponding parts throughout.

DETAILED DESCRIPTION

In the following description of embodiments of dialog signal control and enhancement systems and methods, reference is made to the accompanying drawings. These drawings show by way of illustration specific examples of how embodiments of the dialog control and enhancement systems and methods can be practiced. It is to be understood that other embodiments can be used and structural changes can be made without departing from the scope of the claimed subject matter. In the following description, the term "dialog" refers equivalently to voice, speech, foreground content, or more generally, a preferred portion or component of a content signal in an audio program. The term "non-dialog" refers to any remaining or other portion of an audio program.

Figure 1:
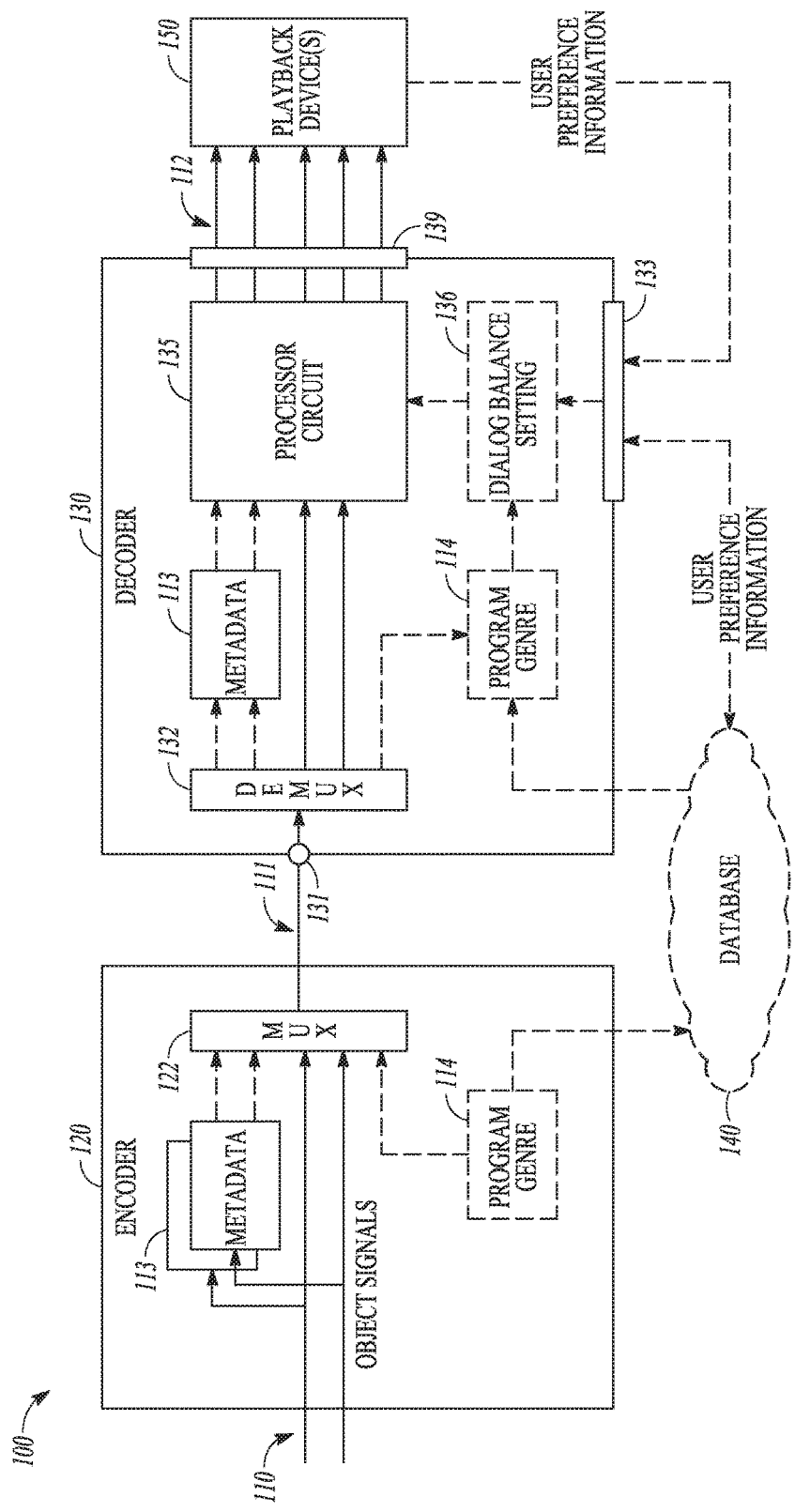
FIG. 1 illustrates generally an example of a dialog control and enhancement system.

FIG. 1 illustrates generally an example of a dialog control and enhancement system 100. The system 100 includes an encoder device 120 configured to receive one or more audio signals 110 representative of one or more respective physical sound waves. The system 100 further includes a decoder device 130 communicatively coupled to the encoder device 120 and configured to receive an encoded audio signal 111 from the encoder device 120. The system 100 further includes playback device(s) 150 that receive one or more output signals 112 from the decoder device 130. The output signals 112 can include one or more digital or analog audio signals comprising a portion of an audio program for playback via one or more loudspeakers coupled to the playback device(s) 150.

The audio signals 110 can include object-based audio signals. In an example, the audio signals 110 include at least a first object-based audio signal that includes a dialog signal, and a second object-based audio signal that includes a non-dialog signal. The encoder device 120 can be configured to read, add, or modify metadata 113 associated with one or more of the first and second object-based audio signals. In an example, the encoder device 120 receives the audio signals 110 and adds respective metadata 113 to the audio signals 110. The metadata 113 can include, among other things, an indication of or information about the audio signal's source, type, genre, loudness, quietness, duration, noise characteristic, frequency content, spatial position, or other information. The object-based audio signals can be received at a multiplexer circuit 122 in the encoder device 120, and an output of the multiplexer circuit 122 can be coupled to an output of the encoder device 120.

The decoder device 130 can include an input 131 configured to receive an encoded audio signal 111, such as can include a multiplexed, object-based audio input signal, from the encoder device 120. The input 131 can be coupled to a de-multiplexer circuit 132 in the decoder device 130, and the de-multiplexer circuit 132 can recover one or multiple different object-based audio signals from the encoded audio signal 111. The decoder device 130 can include a processor circuit 135 that is configured to read the metadata 113 from the recovered object-based audio signals. In an example, the metadata 113 includes loudness metric information respectively associated with each of the recovered object-based audio signals. The decoder device 130 further includes an output 139 that is configured to provide one or more digital or analog audio output signals 112 to the playback device(s) 150.

In an example, the system 100 includes a database 140 that can include various genre information about an audio program or an object-based audio signal. The database 140 can be provided remotely or locally relative to one or both of the encoder device 120 and the decoder device 130. For example, the database 140 can be accessed by the encoder device 120 and/or the decoder device 130 via an intranet or the Internet. In an example, the encoder device 120 is configured to determine or provide genre information 114 about the audio signals 110 to the database 140, such as together with metadata that can be later used by the decoder device 130 to retrieve the genre information 114 corresponding to the same audio signal and/or audio program.

The decoder device 130 can be configured to update or adjust a signal balance between two or more object-based audio signals. In an example, the processor circuit 135 receives a dialog balance setting 136, and then compares the dialog balance setting 136 with a detected or determined dialog balance of the object-based audio signals to be processed by the decoder device 130. If the relationship between the dialog balance setting 136 and the detected or determined dialog balance of the signals meets or exceeds a specified threshold, then the processor circuit 135 can update or adjust a loudness characteristic of one or more of the object-based audio signals 136. Throughout this document, the phrase "dialog balance" can be understood generally to provide an example of a loudness relationship or balance between different audio objects. Other loudness balancing coo/ho similarly performed, such as using multiple non-dialog objects. For example, a loudness relationship or balance between a music object and a sound effects object can be adjusted or tuned using the systems and methods described herein.

In an example, the dialog balance setting 136 can be determined or influenced by a user preference that is input to the decoder device via a second input 133, by device information corresponding to the playback device(s) 150, by the genre information 114, or by other factors. In an example, the user preference can be associated with a personal device (e.g., a mobile smartphone or other device generally associated with one user or one user's preferences), and the personal device can be communicatively coupled with the decoder device 130. The personal device can be configured to share the user preference automatically or in response to a request from the decoder device 130. In an example, a user preference can be stored in the database 140 and can be automatically retrieved by the decoder device 130 when one or more criteria corresponding to the user preference (such as a program genre, playback device characteristic, etc.) are recognized.

The example of FIG. 1 thus includes an end-to-end object-based system that can be configured for dialog control and enhancement. In an example, the system 100 can use object-based loudness metadata, such as can be provided by the encoder device 120, to facilitate detection and correction of, among other things, a dialog-to-non-dialog signal balance, such as at the output 139 of the decoder device 130. In a conventional media broadcast or signal distribution model, detection and correction is performed in real-time at a decoder side. However, in a media streaming/unicast model, detection and correction can be similarly implemented at an encoder or server side.

Various embodiments of the dialog control and enhancement system 100 include or use dialog-to-non-dialog signal level correction techniques. The techniques can optionally include applying a fixed gain (amplification) or attenuation to the dialog elements in an audio program, such as based on a relative dialog loudness measure. Such a relative dialog loudness measure can be called a dialog balance, or dialog salience. In an example, a dialog balance can be deemed valid for an entire duration of an audio program. A characteristic of an entire audio program can be considered "global" characteristic. For example, a global dialog balance can be considered to represent a dialog-to-non-dialog loudness for an entire audio program. In an example, a dialog balance can be deemed valid for a lesser duration than that of an entire audio program, in this example, the dialog balance characteristic can be considered a "long-term" characteristic. Even lesser duration dialog balance characteristics, such as corresponding to about 20 milliseconds or less, can be considered a "short-term" characteristic.

In some embodiments, a user's preferred dialog salience setting can depend on, among other things, a content or genre of the corresponding audio program. Audio program genres can include various classes or types of audio, such as audio corresponding to a live sporting event, talk show, advertisement, concert, movie, TV episode, TV commercial, or other media. In order to enable a "set-and-forget" type of operation, the system 100 can be configured to retrieve or recall a user's preferred dialog balance setting automatically, such as based on information about a genre that corresponds to the audio program. As illustrated in FIG. 1, genre information can be included in an encoded bit stream or retrieved from the database 140.

In some embodiments, the encoder device 120 can be configured to calculate respective loudness values for dialog signals and non-dialog signals. In an example, the encoder device 120 calculates the loudness values for the duration of the audio program to provide a global loudness value for each of the dialog signal and the non-dialog signal. In an example, the encoder device 120 can be configured to calculate or determine a dialog balance as a ratio of the loudness values for the dialog signal and the non-dialog signal. In an example, the determined dialog balance can be transmitted with the object-based content signals. A fixed dialog gain correction can be applied, if necessary, such as to match a user-specified dialog balance at the playback device(s) 150. In an example, a gain can be positive, corresponding to a signal amplification, or a gain can be negative, corresponding to a signal attenuation. If a gain is substantially constant for a duration of an audio program, then signal fidelity can be preserved to a large extent. For example, no signal modification may need to be applied when an audio program's dialog balance (in other words, the default balance setting selected by the program's mixing engineer) already matches a user's preference.

Over the past decade, various broadcast standards organizations and legislatures have issued regulations and technical recommendations for loudness measurement and best practices. Following the regulations and recommendations, the long-term (or integrated) loudness measure of a digital audio program, expressed in LKFS (Loudness, K-weighted, relative to Full Scale) or LUFS (Loudness Units relative to Full Scale), can be calculated as:

$$L = -0.691 + 10 \log_{10} \left[ \Sigma_{(m \in \Omega)} k_m p(m) / |J| \right] \quad (1)$$

where $p(m)$ is a power measured in an audio signal block in, wherein each signal block is 400 ms in duration with 75% overlap, $\Omega$ represents a set of signal blocks selected for inclusion in the power average according to a gating criterion under which lower-level signal frames are discarded, and $|J|$ denotes a count or number of elements in J, which is a set of signal frames retained after gating. For multichannel signals, the power contribution of block m can be weighted by a coefficient $k_m$ whose value depends on spatial position.

In an example, the encoder device 120 can be configured to calculate a combined, integrated loudness $L_D$ of object-based dialog signals over a duration of an audio program, such as per Equation (1), Similarly, the encoder device 120 can be configured to calculate a combined, integrated loudness $L_N$ of object-based non-dialog signals over the duration of the audio program. The values $L_D$ and/or $L_N$ can be encoded as global metadata 113 in a digital audio bitstream, such as in the encoded audio signal 111. In an example, the loudness information can be encoded (e.g., along with a global integrated loudness L representative of the entire audio program, the inclusion of which is in some cases mandated by existing loudness regulations and standards).

Figure 2:
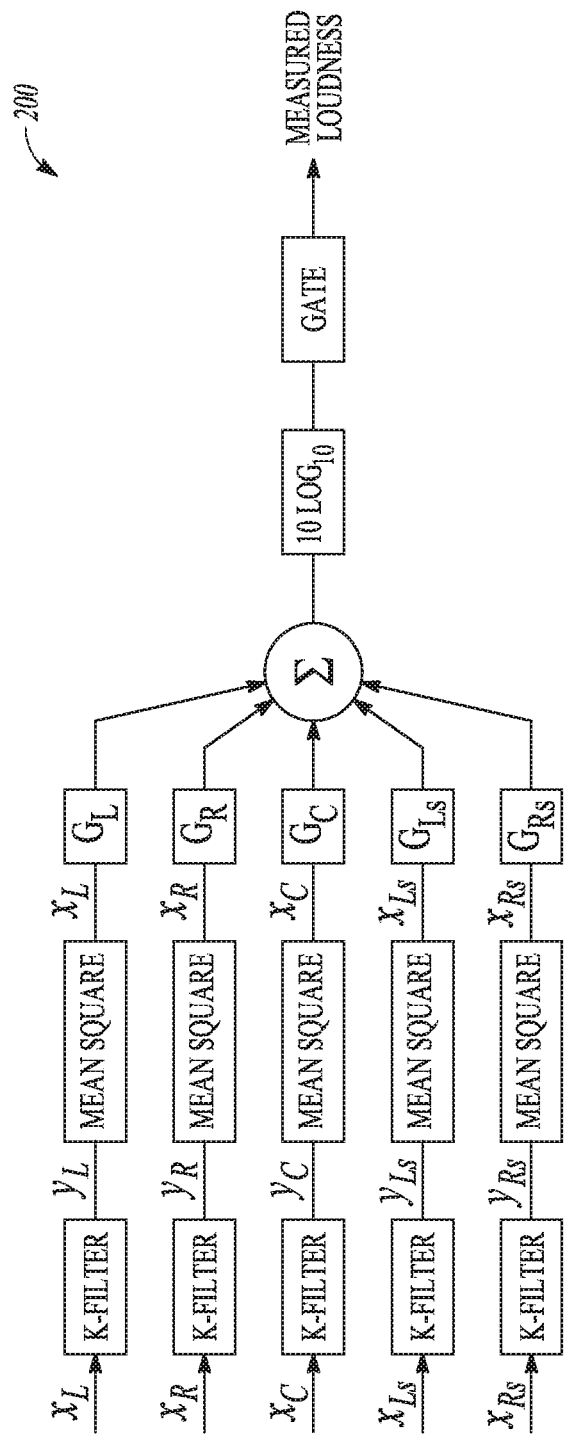
FIG. 2 illustrates generally a block diagram showing a multi-channel loudness processing scheme.

FIG. 2 illustrates generally a block diagram showing a multichannel loudness processing scheme 200. The scheme 200 can be used to model or measure a loudness characteristic over multiple channels, such as in a 5.1 system using five channels (left, center, right, left surround, and right surround). The power measure $p(m)$ for each block m can be evaluated by mean square integration and can include a frequency-dependent weighting known as a "K-filter". The various channels can be independently weighted and then summed. In an example, gating blocks (e.g., comprising 400 ms duration blocks with 75% overlap) can be used. The gating blocks can include various thresholds such as −70 LKFS or −10 dB relative to a level measured after application of the LKFS threshold. Generally, a low frequency effects (LFE) channel is not included in the loudness measurement.

In an example, a long-term dialog balance, expressed in decibels, can be expressed as:

$$S = L_D - L_N \quad (2)$$

where $L_D$ and $L_N$ are calculated according to Equation (1) over respective signal block sets $\Omega_D$ and $\Omega_N$. The block sets $\Omega_D$ and $\Omega_N$ are defined by restricting $\Omega$ to dialog objects and non-dialog objects, respectively.

In an example, a dialog balance preference indicator can be used. Although generally referred to herein as a "dialog" balance preference indicator, the indicator can be similarly understood to be a "non-dialog" loudness preference indicator, or more generally a balance or relationship indicator. In an example, the dialog loudness preference indicator can be denoted $S_P$. Gain offsets $G_D$ and $G_N$, such as can be applied to dialog objects and non-dialog objects, respectively, can be derived by resolving the system of equations (3) and (4):

$$G_d - G_N = S_P - S \quad (3)$$

$$\text{pow}(L_D - G_D) + \text{pow}(L_N + G_N) = \text{pow}(L) \quad (4)$$

In Equation (4), pow( ) denotes conversion from LUFS to power, i.e. $\text{pow}(L) = |J| \exp_{10}[(L + 0.691)/10]$, such as per Equation (1). Equation (3) expresses dialog balance correction, while Equation (4) ensures overall audio program loudness conservation.

Figure 3:
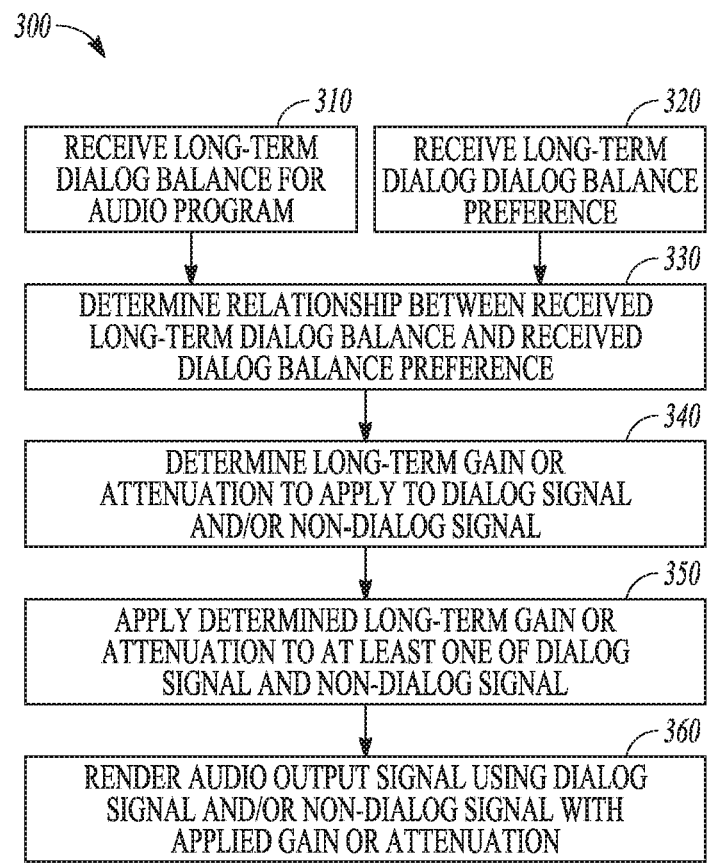
FIG. 3 illustrates generally a method that includes determining a long-term gain or attenuation to apply to a dialog signal and/or a non-dialog signal.
Figure 4:
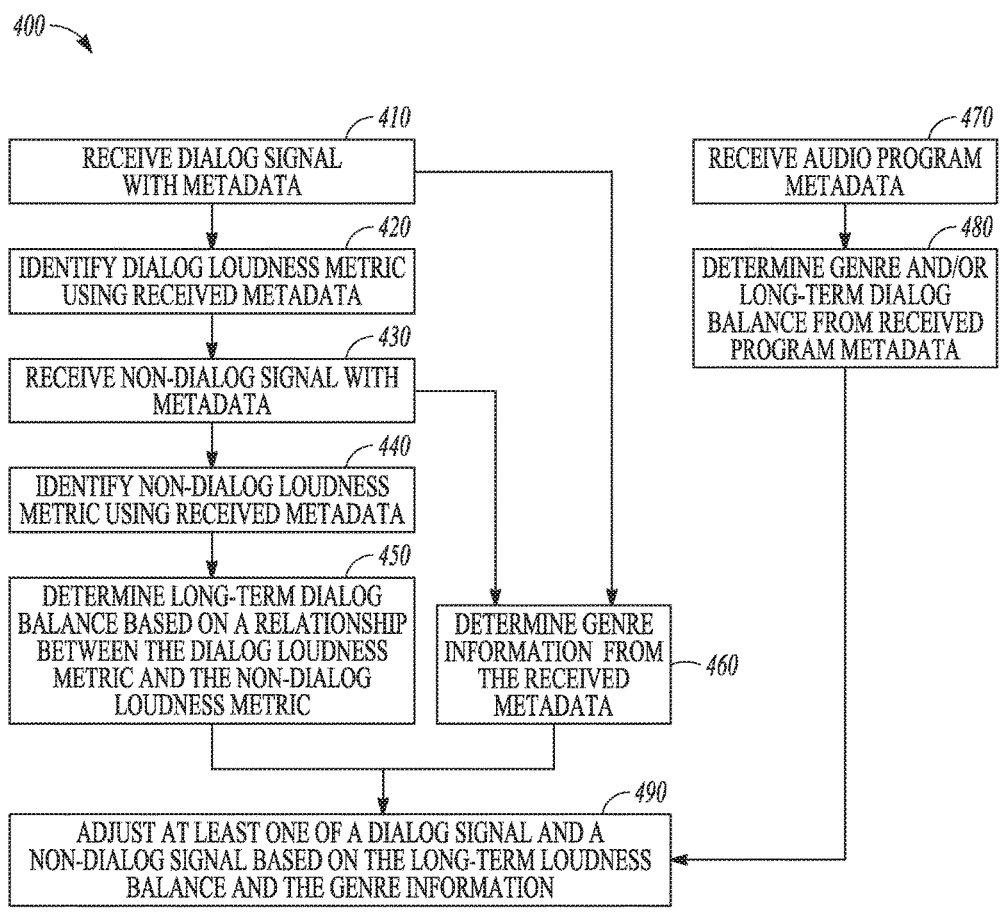
FIG. 4 illustrates generally a method that includes adjusting a loudness of a dialog signal and/or a non-dialog signal.

Various non-limiting examples are provided to illustrate how a dialog loudness preference indicator can be used to render an enhanced output signal from object-based dialog and non-dialog audio signals, such as using various components of the example system 100 of FIG. 1. FIG. 3, for example, illustrates generally a method 300 that includes determining a long-term gain or attenuation to apply to a dialog signal and/or a non-dialog signal. FIG. 4 illustrates generally a method 400 that includes adjusting a loudness of a dialog signal or a non-dialog signal.

In the example of FIG. 3, at operation 310, a long-term dialog balance for an audio program can be received, such as by the decoder device 130. The dialog balance can be calculated, such as using Equation (1), or using a portion of the scheme 200 of FIG. 2. In an example, the dialog balance is calculated using other means or methods, or information about the dialog balance can be retrieved from the metadata 113. The long-term dialog balance received at operation 310 can include information about a dialog-to-non-dialog loudness relationship of the audio program. FIG. 4, which is further discussed below, illustrates generally an example of determining a long-term dialog balance, such as can be used at operation 310.

At operation 320, a dialog balance preference can be received, such as by the decoder device 130. The dialog balance preference indicates a preference (e.g., a user preference) for a particular balance or mix of dialog audio with respect to non-dialog audio or other audio program content. In an example, the dialog balance preference can be received or determined based on a user preference, based on a playback device type or environment indication, based on audio program or signal-level or program-level genre information, or based on other information. The dialog balance preference can be used, in the example of FIG. 1, to provide the dialog balance setting 136.

At operation 330, the method of FIG. 3 includes determining a relationship between the received long-term dialog balance and the received dialog balance preference. Determining the relationship can include identifying a magnitude difference between the received long-term dialog balance and the received dialog balance preference, such as to determine whether an audio program's dialog balance corresponds to the dialog balance preference. If the audio program's dialog balance is greater or less than the dialog balance preference by more than a specified threshold amount, then various corrective actions can be taken. For example, if the audio program's dialog balance indicates a dialog-to-non-dialog loudness relationship that exceeds or is sufficiently greater than the dialog balance preference, then the processor circuit 135 can attenuate, cut, or deemphasize object-based dialog signals and/or can amplify, boost, or apply gain to object-based non-dialog signals. If the audio program's dialog balance indicates a dialog-to-non-dialog loudness relationship that is sufficiently less than the dialog balance preference, then the processor circuit 135 can amplify or boost object-based dialog signals and/or can attenuate object-based non-dialog signals. If the audio program's dialog balance indicates the dialog-to-non-dialog loudness relationship substantially corresponds to the dialog balance preference, then the processor circuit 135 can process object-based dialog and non-dialog signals according to default values, such as provided by an original content mix engineer.

At operation 340, the method of FIG. 3 includes determining a long-term gain or attenuation to apply to an object-based dialog signal and/or to an object-based non-dialog signal. For example, based on a magnitude of a difference between the long-term dialog balance and the dialog balance preference, such as determined at operation 330, the processor circuit 135 or other processor can be used to determine a corresponding magnitude of gain or attenuation to apply to an object-based audio signal to compensate for the difference.

At operation 350, the method can include applying the long-term gain or attenuation that was determined at operation 340, such as to one or both of the object-based dialog and non-dialog signals. In an example, the processor circuit 135, or other dedicated signal processor included in or communicatively coupled with the decoder device 130, can be used to apply the gain or attenuation to a specified audio signal. At operation 360, the method can include rendering an audio output signal using a gain-corrected version of at least one, and optionally both, of object-based dialog and non-dialog signals. For example, rendering the audio output signal can include using the processor circuit 135 or one or more output stages or amplifier circuits of the decoder device 130 to provide the one or more output signals 112.

Referring now to another example of using a loudness metric, FIG. 4 illustrates generally a method 400 that includes adjusting a loudness of a dialog signal or a non-dialog signal. At operation 410, the method includes receiving an object-based dialog signal, such as a signal that includes the metadata 113. In this example, the metadata 113 can include a loudness indication for the dialog signal. At operation 420, the method includes identifying or retrieving the dialog signal's loudness metric from the metadata 113, such as using the processor circuit 135. In an example, the loudness metric identified at operation 420 is a long-term loudness metric.

Operations 430 and 440 can be performed similarly to operations 410 and 420, respectively. For example, at operation 430, the method includes receiving an object-based non-dialog signal, such as including with the metadata 113. In this example, the metadata 113 can include a loudness indication for the non-dialog signal. At operation 440, the method includes identifying or retrieving the non-dialog signal's loudness metric from the metadata 113, such as using the processor circuit 135. Although the metadata 113 is referenced collectively herein using a single reference numeral, it is to be understood that any one or more object-based signals can include or can be associated with its own discrete or unique metadata.

At operation 450, the method includes determining a long-term dialog balance (e.g., a long-term dialog loudness balance). In an example, the long-term dialog balance is determined based on a relationship between the dialog loudness metric (e.g., identified or determined at operation 420) and the non-dialog loudness metric (e.g., identified or determined at operation 440). In an example, the long-term dialog balance is determined based on a difference between the dialog and non-dialog loudness metrics. In an example, more complicated algorithms can be used to determine the relationship. For example, the dialog and non-dialog loudness metrics can include metrics for discrete frequency components or frequency bands, and the long-term dialog balance can be based on a weighted or non-weighted comparison of one or more metrics representing the various frequency components or bands. In an example, different relationships can be determined for different block or sample lengths. In an example, the determined long-term dialog balance can be applied in the example of FIG. 3, such as at operation 310.

In the method of FIG. 4, operation 460 can include determining, or receiving information about, a genre of an audio program that corresponds to one or both of the dialog signal received at operation 410 and the non-dialog signal received at operation 430. In an example, operation 460 can include using the decoder device 130 to process the metadata 113, such as can be received with at least one of the object-based signals, to determine or read information about the genre from the metadata 113. Operation 460 can additionally or alternatively include using genre information 114 retrieved from the database 140. The determined genre can be associated with a previously-specified or default dialog loudness balance. For example, different genres can be associated with respective different audio program dialog balance amounts, or different preferred relationships between dialog and non-dialog signals. Thus a genre such as a sports broadcast can be associated with a first audio program dialog balance that is different than a second audio program dialog balance that is associated with a theatrical performance.

In an example, the method 400 includes operation 470, including receiving audio program metadata, such as from a portion of the encoded audio signal 111, or from the database 140. The audio program metadata can include, among other things, information or characteristics related to the audio program itself, or information or characteristics related to object signal components of the program. At operation 480, the decoder device 130 can be configured to determine a genre of the audio program using the metadata received at operation 470. At operation 480, the decoder device 130 can additionally or alternatively be configured to determine a long-term dialog balance using the metadata received at operation 470. Determining the genre and/or long-term dialog balance can include reading previously-encoded information about the genre and/or balance, or it can include computing the genre and/or long-term dialog balance using other information or characteristics mined from the received metadata.

At operation 490, the method of FIG. 4 includes adjusting at least one of the dialog signal (e.g., received at operation 410) and the non-dialog signal (e.g., received at operation 430) based on a long-term dialog balance (e.g., determined at operation 450 or 480), and is optionally further based on a genre (e.g., determined at operation 460 or 480). For example, a dialog loudness can be adjusted based on a relationship between the long-term dialog balance determined at operation 450 and a dialog balance preference associated with the determined genre. In an example, determining the relationship, determining a gain or attenuation to apply to a dialog and/or non-dialog signal, applying the determined gain or attenuation, and rendering an audio output can be performed analogously to the method described in FIG. 3 at operations 330, 340, 350, and 360, such as by substituting the dialog balance preference in FIG. 3 with the dialog balance associated with a determined genre in FIG. 4.

Although long-term dialog dialog balance personalization, as described above, can be used to improve a user's listening comfort, such as globally over the duration of a program and across multiple different audio program types or genres, such a long-term or static correction may, in some instances, be insufficient for mitigating temporary drops in dialog signal loudness relative to non-dialog or background signal loudness. In an example, a short-term dialog loudness imbalance can be provided intentionally, such as in a video soundtrack, in order to evoke distant character dialogue or temporarily emphasize music or sound effects for emotional impact. Such an imbalance can negatively affect listening comfort for some users, owing to variable factors such as hearing loss, non-native language, or adverse listening conditions. Long-term dialog balance correction may be an insufficient remedy for short-term loudness imbalances, such as because long-term dialog balance correction can operate globally, or over a longer duration, such as using a static or constant corrective gain or attenuation characteristic. A corrective gain that is large enough to compensate for an undesired short-term loudness imbalance can unnecessarily or undesirably apply gain to a dialog signal in other parts of the audio program.

Some embodiments of the present systems and methods include components and techniques that can be used to ensure that short-term dialog salience or balance can be maintained above a preferred level controlled by the user. In such embodiments, a dialog signal can be emphasized temporarily, or only when necessary, and by an amount sufficiently high to meet or exceed a user's preference. This function or technique is referred to herein as "dialog protection".

Figure 5:
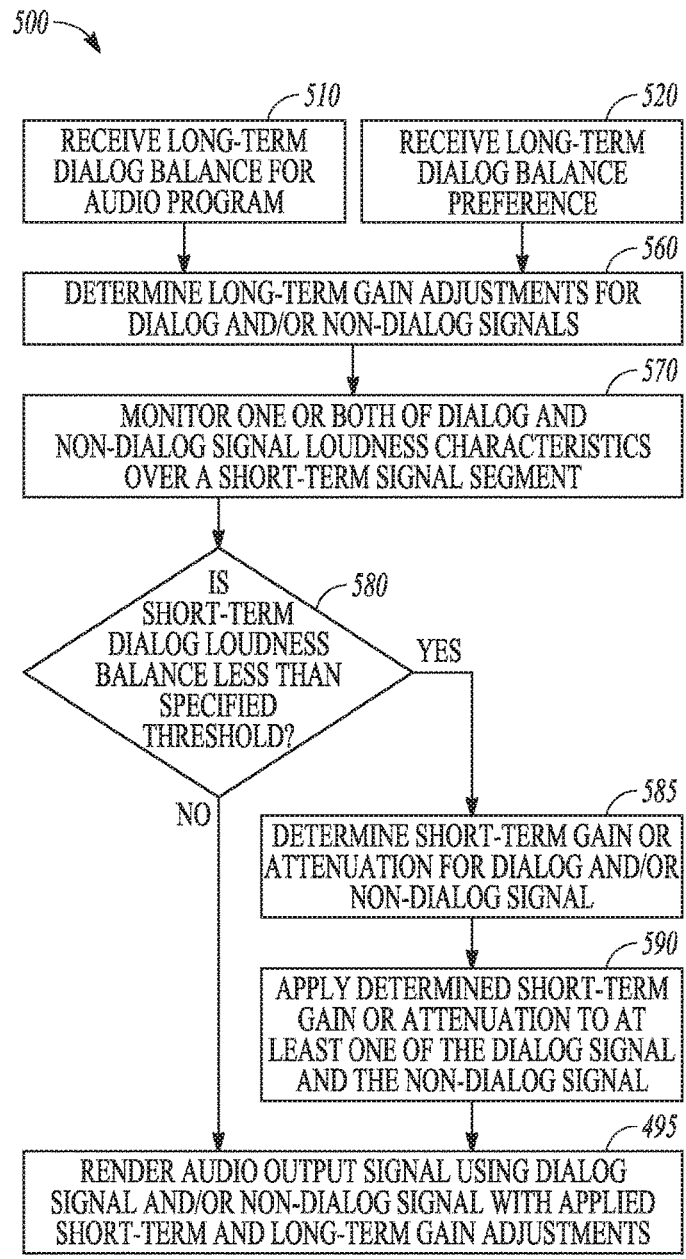
FIG. 5 illustrates generally a method that includes applying a short-ten or attenuation to a dialog signal and/or a non-dialog signal.

FIG. 5 illustrates generally a dialog protection method 500 that includes applying a short-term gain or attenuation to a dialog signal and/or a non-dialog signal in an audio program. At operation 510, the method includes receiving a long-term dialog balance for the audio program, and at operation 520, the method includes receiving a long-term dialog balance preference. The operations 510 and 520 correspond generally to the operations 310 and 320 described above in the example of FIG. 3. At operation 560, long-term gain adjustments can be determined for dialog or non-dialog signals, such as based on the dialog balance received at operation 510 and based on the received dialog balance preference at operation 520.

At operation 570, the method 500 includes monitoring one or both of dialog and non-dialog signal loudness values over short-term signal blocks or segments. The signal loudness values can be monitored, for example, using the processor circuit 135 of the decoder device 130, or using another processor or module. In an example, the signal loudness values are monitored for discrete short-term signal segments, generally 20 ms or less in duration.

At operation 580, the method 500 includes determining whether short-term dialog balance, such as monitored at operation 570, is less than a specified threshold balance. In an example, operation 580 can additionally or alternatively include determining whether the short-term dialog balance corresponds to a specified group of balance values (e.g., in a histogram). In an example, operation 580 includes determining whether the dialog balance differs from a reference by greater than a specified amount.

If the monitored dialog balance value meets the criteria in operation 580, then the method 500 continues at operation 585 with determining a short-term gain or attenuation for a dialog and/or non-dialog signal. Next, at operation 590, the example includes applying the determined short-term gain or attenuation to at least one of the dialog signal and the non-dialog signal, such as to mitigate or address a sudden or temporary change in a balance or relationship between dialog and non-dialog signals.

If the monitored loudness characteristic value does not meet the criteria in operation 580, then the method 500 continues at operation 595 rendering an audio output signal using a long-term gain-corrected version of at least one, and optionally both, of object-based dialog and non-dialog signals. For example, rendering the audio output signal can include using the processor circuit 135 or one or more output stages or amplifier circuits of the decoder device 130 to provide the one or more output signals 112.

Figure 6:
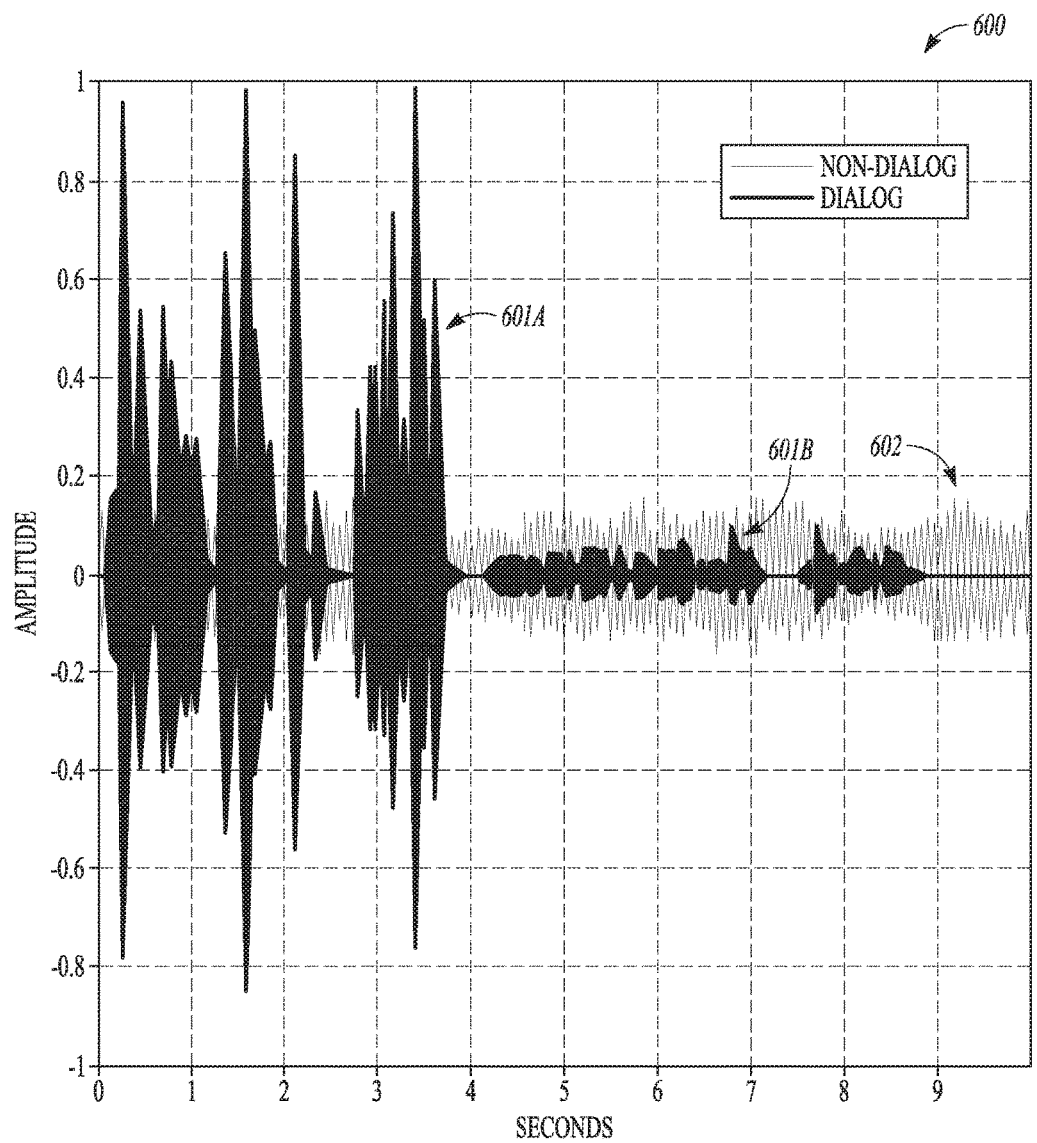
FIG. 6 illustrates generally an example of a dialog audio signal waveform and a non-dialog audio signal waveform.

FIG. 6 illustrates generally an example 600 of a dialog audio signal waveform 601A/601B, and a non-dialog audio signal waveform 602. For clarity, the different signals are assumed to be mono signals. In the example 600, during the first approximately 4 seconds, a short-term loudness of a first portion of the dialog audio signal waveform 601A is substantially greater than a short-term loudness of the non-dialog audio signal waveform 602. Beginning at approximately 4 seconds, a short-term loudness of a second portion of the dialog audio signal waveform 601B is substantially less than a short-term loudness of the quieter non-dialog audio signal waveform 602.

In an example, the dialog protection technique (e.g., described above in the example of FIG. 5) can operate on an overlapping or non-overlapping block-by-block basis, wherein block durations are typically 5 to 20 ms. A corrective gain can be calculated for each block, interpolated, and then applied sample-by-sample to the corresponding dialog and non-dialog audio signals. A brief description of the dialog protection technique follows.

In an example, a short-term dialog balance signal can be expressed (e.g., in decibels) as:

$$s(m) = I_D(m) - I_N(m) \tag{5}$$

In Equation (5), in is a block index, $I_D(m)$ denotes a short-term loudness of a dialog object for block m, and $I_N(m)$ is a short-term loudness of a non-dialog object for the same block tn. The values $I_D(m)$ and $I_N(m)$ can be calculated for block index in by, for example, performing power averaging on the dialog objects and the non-dialog objects, respectively, such as using an un-gated version of Equation (1).

Figure 7:
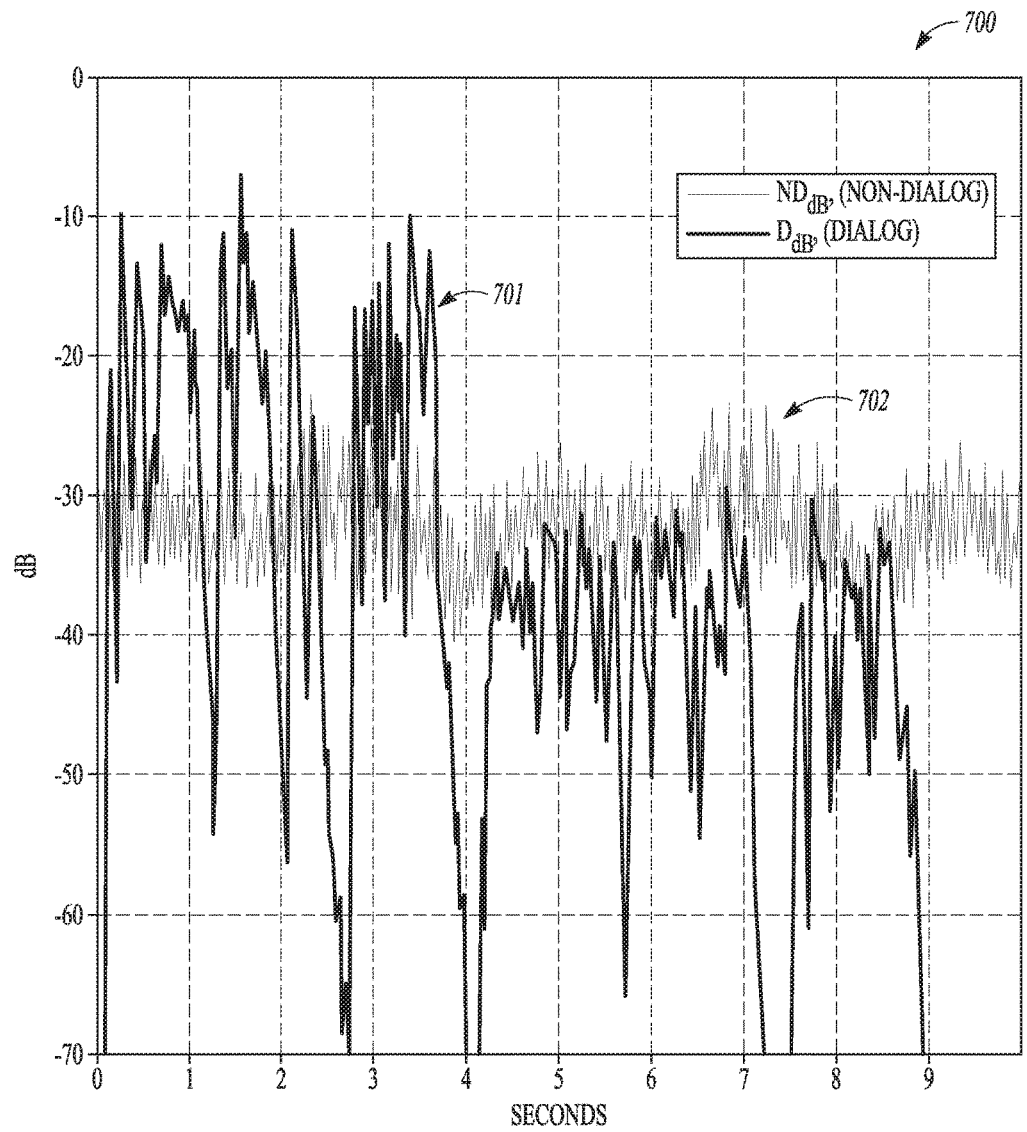
FIG. 7 illustrates generally an example of short-tenor loudness measures of a dialog audio signal and a non-dialog audio signal.

FIG. 7 illustrates generally an example 700 of short-term loudness measures of a dialog audio signal and a non-dialog audio signal. A first curve 701 corresponds to short-term loudness measures for the first and second portions of the dialog audio signal waveform 601A and 601B. A second curve 702 corresponds to short-term loudness measures for the non-dialog audio signal waveform 602. In an example, a short-term loudness measure can be calculated for a multi-channel object or a mixture of objects.

In an example, the dialog protection technique can be used to ensure that the short-term dialog balance signal, s(m), is maintained substantially above a threshold or within a user-defined preference range, such as determined by a user's short-term dialog balance preference and/or a genre of the audio program. The short-term dialog balance preference is denoted herein as $s_P$, which in an example can represent a minimum short-term dialog balance (or dialog-to-non-dialog balance) that a user can tolerate before listening comfort is compromised. From the short-term dialog balance signal s(m) and the minimum $s_P$, a time-varying gain offset can be calculated. For simplicity, and to avoid spectral modification or various audible artifacts, a broadband corrective gain offset can be applied.

Figure 8:
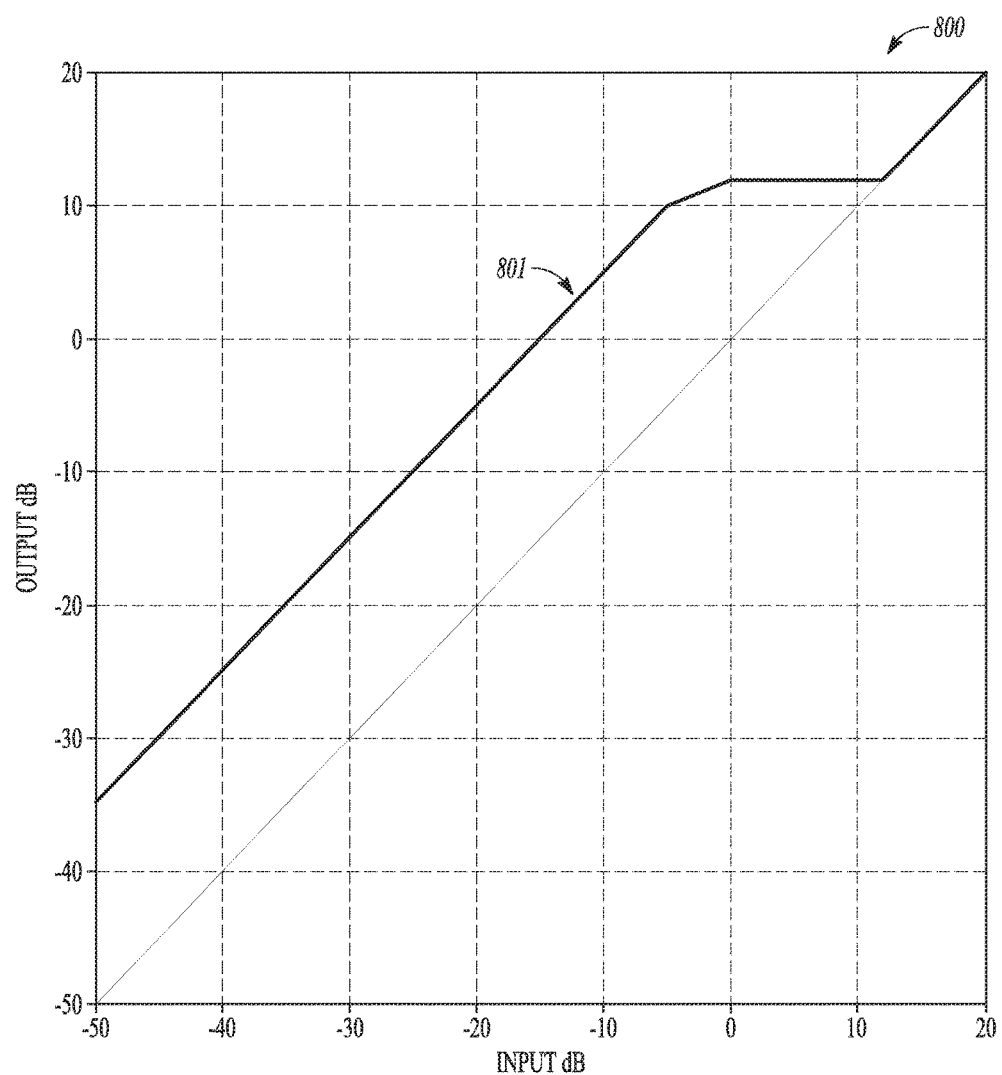
FIG. 8 illustrates generally an example of a mapping between a short-term dialog balance measure and a gain or attenuation offset.

FIG. 8 illustrates generally an example of a mapping between a short-term dialog balance measure and a gain or attenuation offset. In the example 800, the input along the x axis represents a short-term loudness difference or ratio detected in an audio program, such as between dialog and non-dialog signal components. The output along the y axis represents a gain. The example 800 includes a gain curve 801. The gain curve 801 represents a minimum dialog balance $s_P$=12 dB and a maximum gain of 15 dB. In the example 800, for inputs below about −5 dB, the maximum gain of +15 dB can be provided. No gain is provided at or above input values that meet or exceed the minimum, $s_P$=12 dB.

Figure 9:
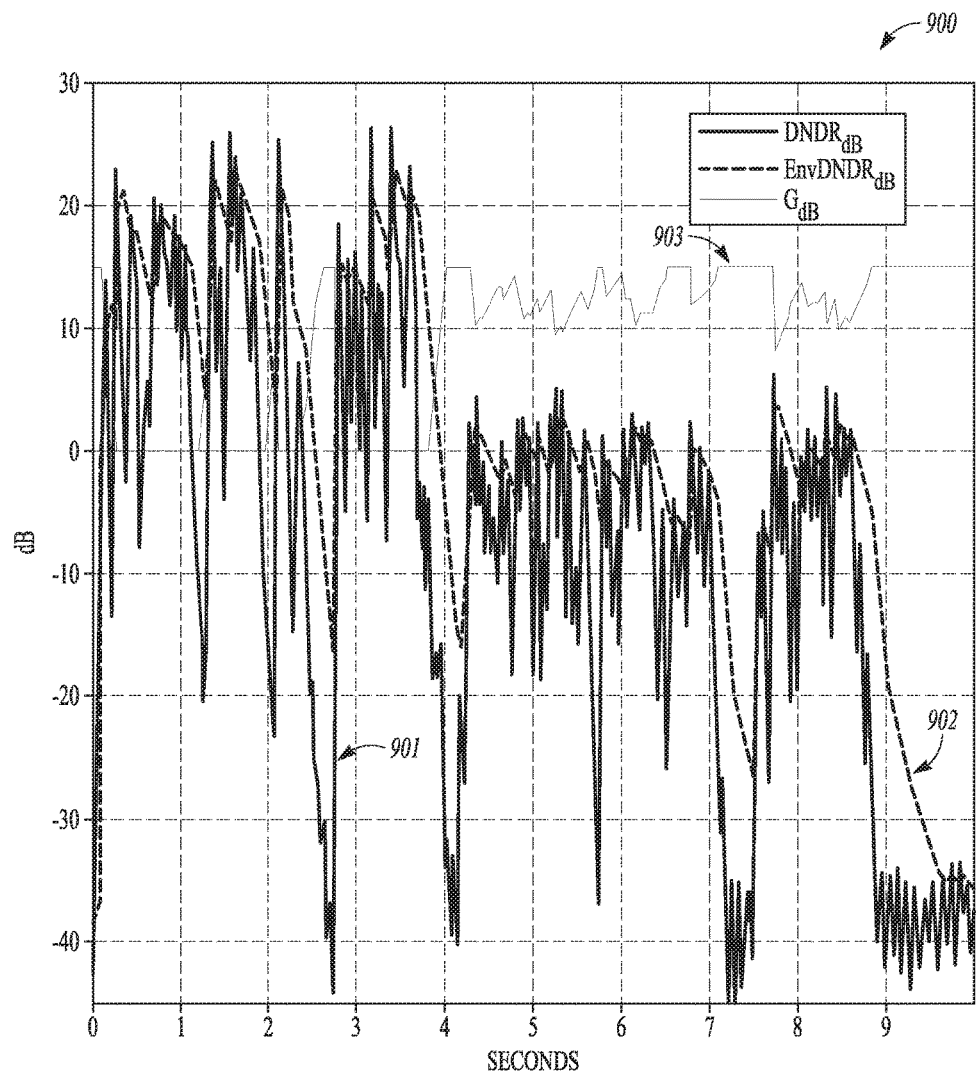
FIG. 9 illustrates generally an example of a short-term balance signal, a smoothed short-term balance signal, and a gain or attenuation offset for a dialog signal or a non-dialog signal.

The mapping from the example of FIG. 8 can be applied to a dialog audio signal, such as one corresponding to the dialog audio signal waveform 601A/601B from the example 600 of FIG. 6. For example, FIG. 9 illustrates generally an example 900 of a short-term dialog balance signal s(m) 901, a smoothed short-term balance signal $s_{env}$(m) 902, and a gain offset signal g(m) 903 for a dialog signal or a non-dialog signal. In the example of FIG. 9, the short-term dialog balance signal s(m) can be smoothed by a first order filter with a forgetting factor α, such as to provide a fast-attack and slow-release envelope, or smoothed short-term balance signal $s_{env}$(m) as follows:

$$s_{env}(m) = \alpha s(m) + (1-\alpha)s_{env}(m-1) \quad (6)$$

Values of the smoothed signal $s_{env}$(m) 902 can be mapped to corresponding values in the gain offset signal g(m) 903, such as via a dynamic range compression (DRC) curve, as illustrated in FIG. 8.

The fast-attack/slow-release envelope smoothing, maximum gain, and soft-knee compression curve help to minimize audible artifacts. The resulting gain offset signal g(m) 903 can be converted to two gain sequences, $g_D$(m) and $g_N$(m), such as can be applied respectively to dialog objects and non-dialog objects, and as can be verified by $g_D$(m)−$g_N$(m)=g(m). In an example, the block-based decibel gain sequences can be converted to the linear domain and linearly interpolated to sample-based gain sequences.

Figure 10:
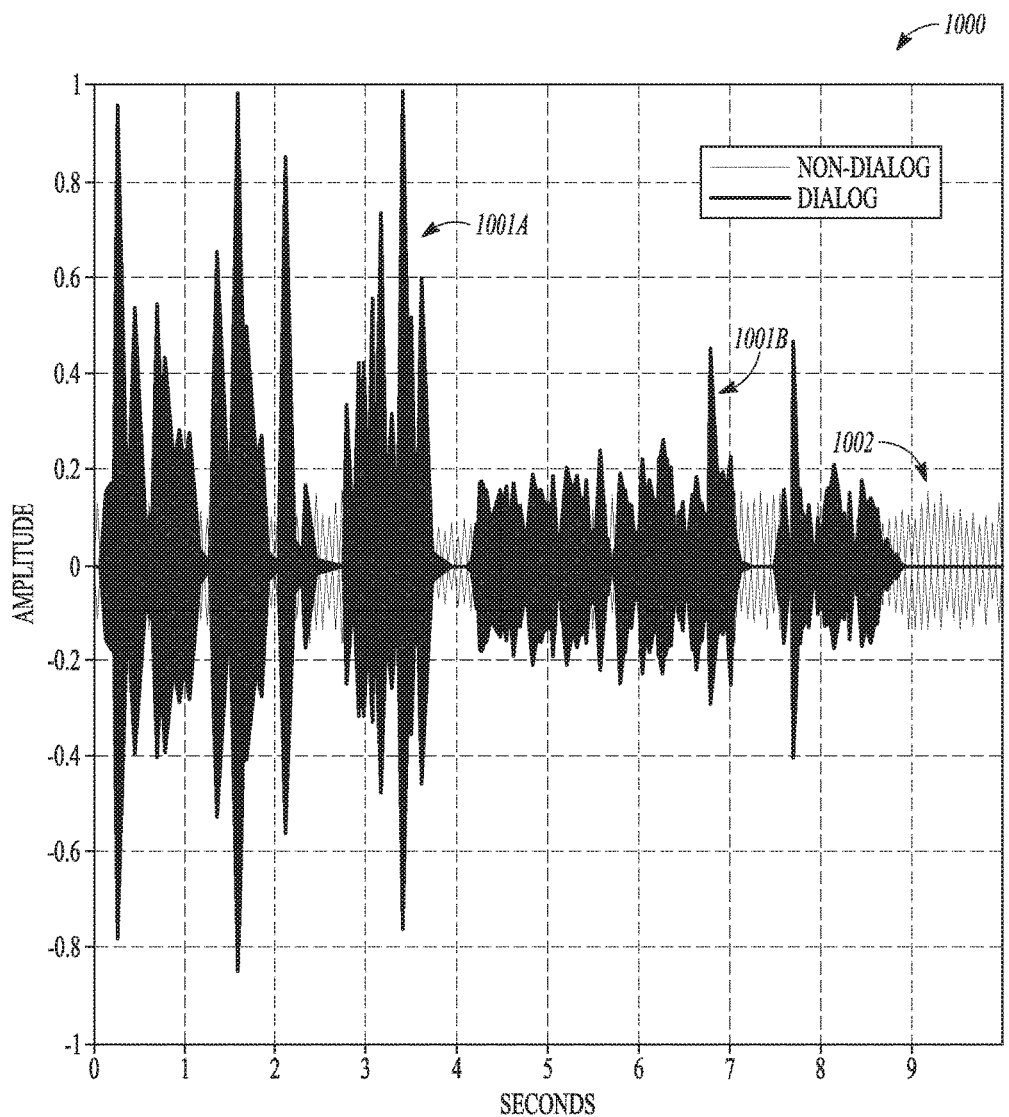
FIG. 10 illustrates generally an example of an enhanced dialog signal waveform and a non-dialog signal waveform.

FIG. 10 illustrates generally an example 1000 of an enhanced dialog signal waveform and a non-dialog signal waveform. The example 1000 includes the dialog audio signal waveform 601A/601B processed according to the gain offset signal g(m) 903 from the example 900 to yield enhanced dialog and/or non-dialog signals. The example 1000 illustrates the case where $g_D$(m)=$g_N$(m) and $g_N$(m)=0 dB. In the example 1000, a relatively high amplitude first portion of the enhanced dialog audio signal waveform 1001A is substantially unchanged compared to the input signal waveform (e.g., corresponding to the first portion of the dialog audio signal waveform 601A in the example of FIG. 6), while the lower-amplitude second portion of the enhanced dialog audio signal waveform 1001B, such as after about 4.0 seconds in the example 1000, is substantially amplified as compared to the input signal waveform (e.g., corresponding to the second portion of the dialog audio signal waveform 601B in the example of FIG. 6).

Figure 11:
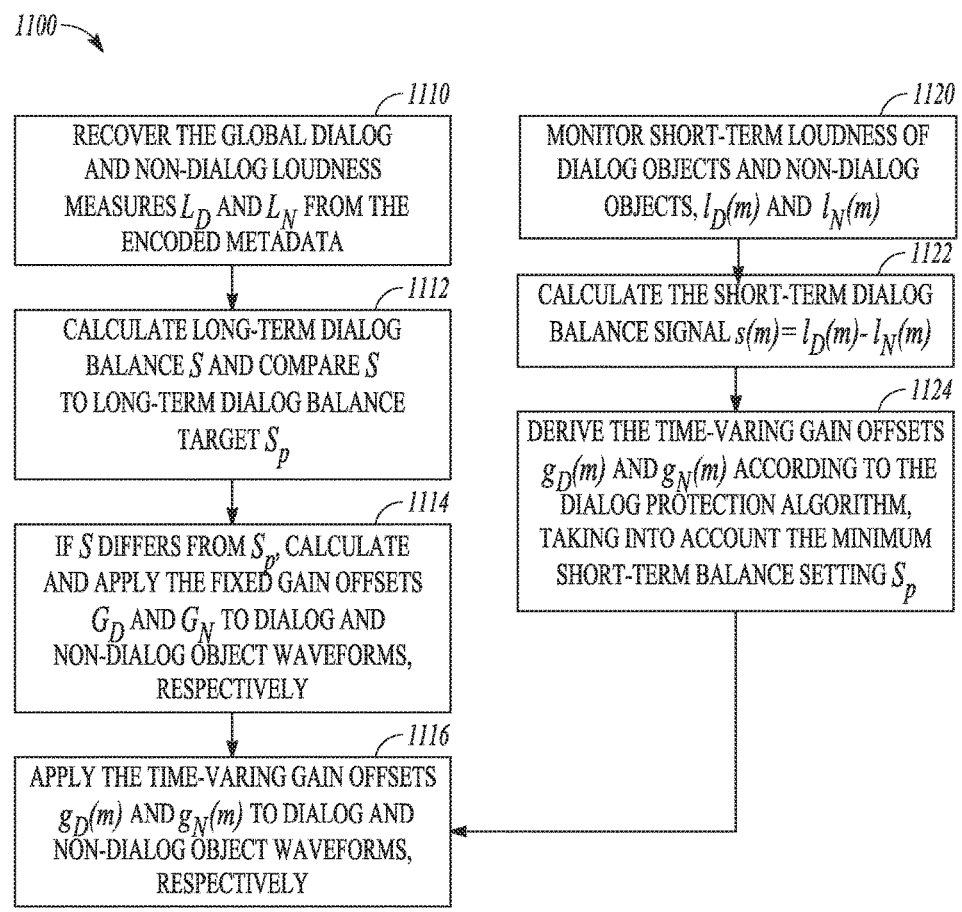
FIG. 11 illustrates generally a method that includes long-term and short-term signal balancing.

FIG. 11 illustrates generally a method 1100 that includes long-term and short-term signal balancing. As shown in the example 1100, long-term and short-term balance corrections can be applied as two consecutive processing stages with no dependencies on one another; however, they can optionally be combined into a single analysis and gain stage.

At operation 1110, the method 1100 can include recovering long-term dialog and non-dialog loudness measures or metrics, $L_D$ and $L_N$, respectively, such as from the encoded metadata 113. At operation 1120, the method can include monitoring short-term loudness for object-based dialog and non-dialog signals, respectively denoted $I_D$(m) and $I_N$(m). In other examples, short-term loudness metadata can be calculated, such as at an encoder side (e.g., using the encoder device 120) and transmitted for individual objects or for object groups (such as designated "dialog" and "non-dialog" signal groups).

Having recovered $L_D$ and $L_N$ and $I_D$(m) and $I_N$(m), a dialog gain offset $G_D$(m) and a non-dialog gain offset $G_N$(m) can be calculated, such as using the decoder device 130. In an example, the gain offsets can include a fixed dialog balance correction and a short-term dialog balance correction, such as if either is desired for dialog balance personalization and/or dialog protection, as defined above.

At operation 1112, an audio program's long-term dialog balance S can be calculated and compared to a long-term dialog balance target $S_P$, such as can be set by a user and/or influenced by a signal type (e.g., genre corresponding to the signal). If the long-term dialog balance S and the target $S_P$ are different, such as by greater than a specified amount, then the fixed gain offsets $G_D$ and $G_N$, calculated according to Equations (3) and (4), can be applied at operation 1114 to the dialog and non-dialog signals, respectively.

Optionally, the corrected signals from operation 1114 can be processed at operation 1122 according to the dialog protection techniques described herein, which can take into account a short-term dialog balance signal s(m)=$I_D$(m)−$I_N$(m) and a minimum balance setting $s_P$, such as can be specified by the user and/or influenced by a signal type (e.g., genre corresponding to the signal). Resulting time-varying gain offsets $g_D$(m) and $g_N$(m) can then be determined at operation 1124, and then applied to corresponding object waveforms at operation 1116.

In an example, if $I_D$(m) and $I_N$(m) are calculated at the encoder device 120 and transmitted with the metadata 113, then the loudness signals can be offset by the long-term dialog balance corrective gains $G_D$ and $G_N$ gains applied in the first stage (e.g., at operation 1114). For example, short-term dialog protection gain offsets can cause a slight error in the resulting long-term dialog balance signals measured at the output. However, in practice, this effect is not significant enough to be objectionable.

Various aspects of the invention can be used independently or together. For example, Aspect 1 can include or use subject matter (such as an apparatus, a system, a device, a method, a means for performing acts, or a device readable medium including instructions that, when performed by the device, can cause the device to perform acts), such as can include or use a method for adjusting a relationship between dialog and non-dialog signals in an audio program. Aspect 1 can include receiving, using a processor circuit, a long-term dialog balance for the audio program, the long-term dialog balance indicating a dialog-to-non-dialog loudness relationship of the audio program, and receiving, using the processor circuit, a long-term dialog balance preference. Aspect 1 can further include determining, using the processor circuit, a long-term gain or attenuation to apply to at least one of the dialog signal and the non-dialog signal of the audio program, the long-term gain or attenuation determined according to a difference between the received long-term dialog balance for the audio program and the received long-term dialog balance preference.

Aspect 2 can include or use, or can optionally be combined with the subject matter of Aspect 1, to optionally include determining the long-term gain to apply to the dialog signal of the audio program, applying the determined long-term gain to the dialog signal using the processor circuit to generate a gain-adjusted dialog signal, and rendering an audio output signal that includes a combination of the gain-adjusted dialog signal and the non-dialog signal.

Aspect 3 can include or use, or can optionally be combined with the subject matter of one or any combination of Aspects 1 or 2 to optionally include determining the long-term attenuation to apply to the dialog signal of the audio program, applying the determined long-term attenuation to the dialog signal using the processor circuit to generate an adjusted dialog signal, and rendering an audio output signal that includes a combination of the adjusted dialog signal and the non-dialog signal.

Aspect 4 can include or use, or can optionally be combined with the subject matter of one or any combination of Aspects 1 through 3 to optionally include determining different respective long-term gain or attenuation amounts to apply to the dialog signal and the non-dialog signal.

Aspect 5 can include or use, or can optionally be combined with the subject matter of one or any combination of Aspects 1 through 4 to optionally include receiving, using the processor circuit, a long-term dialog loudness metric corresponding to the dialog signal of the audio program, receiving a long-term non-dialog loudness metric corresponding to the non-dialog signal of the audio program, and providing, using the processor circuit, the long-term dialog balance based on a difference between the received dialog and non-dialog loudness metrics.

Aspect 6 can include or use, or can optionally be combined with the subject matter of one or any combination of Aspects 1 through 5 to optionally include receiving the dialog signal at the processor circuit, the dialog signal including first metadata with information about a global loudness of the dialog signal for the audio program, and receiving the non-dialog signal at the processor circuit, the non-dialog signal including second metadata with information about a global loudness of the non-dialog signal for the audio program. In Aspect 6, receiving the long-term dialog balance for the audio program can include determining, using the processor circuit, the long-term dialog balance based on the global loudness of the dialog signal and the global loudness of the non-dialog signal.

Aspect 7 can include or use, or can optionally be combined with the subject matter of one or any combination of Aspects 1 through 6 to optionally include determining the long-term gain or attenuation, including determining a static gain or attenuation to apply to the dialog signal for a duration of the audio program.

Aspect 8 can include or use, or can optionally be combined with the subject matter of one or any combination of Aspects 1 through 7 to optionally include receiving the dialog loudness preference, including receiving a genre-specific dialog loudness preference, the genre-specific dialog loudness preference corresponding to a genre of the audio program. Aspect 8 can optionally include receiving a genre-specific dialog loudness preference that was previously set by a user and stored by a decoder and/or by a remote database.

Aspect 9 can include or use, or can optionally be combined with the subject matter of Aspect 8 to optionally include determining the genre of the audio program based on metadata recovered from the dialog signal and/or from the non-dialog signal.

Aspect 10 can include or use, or can optionally be combined with the subject matter of one or any combination of Aspects 1 through 9 to optionally include receiving the dialog loudness preference includes receiving a playback device-specific dialog loudness preference, the playback device-specific dialog loudness preference corresponding to a playback device that is configured to play the audio program.

Aspect 11 can include or use or can optionally be combined with the subject matter of one or any combination of Aspects 1 through 10 to optionally include receiving, using the processor circuit, a short-term dialog balance for each of multiple segments of the audio program, wherein each short-term dialog balance indicates a dialog-to-non-dialog loudness relationship for a specified segment, receiving, using the processor circuit, a short-term dialog balance preference, and determining, using the processor circuit, a short-term gain or attenuation to apply to at least one of the dialog signal and the non-dialog signal, the short-term gain or attenuation determined according to a difference between the received short-term loudness balance for a specified one of the segments and the short-term dialog loudness preference.

Aspect 12 can include or use, or can optionally be combined with the subject matter of Aspect 11, to optionally include providing a gain-adjusted dialog signal and/or a gain-adjusted non-dialog signal by (1) applying the determined long-term gain or attenuation to at least one of the dialog signal and the non-dialog signal, and (2) applying the determined short-term gain or attenuation to at least one of the dialog signal and the non-dialog signal. Aspect 12 can further include rendering an audio output signal that includes the gain-adjusted dialog signal and/or the gain-adjusted non-dialog signal.

Aspect 13 can include, or can optionally be combined with the subject matter of one or any combination of Aspects 1 through 12 to include or use, subject matter (such as an apparatus, a method, a means for performing acts, or a machine readable medium including instructions that, when performed by the machine, that can cause the machine to perform acts), such as can include or use an audio signal processing system comprising a decoder device. The decoder device can include, among other things, a first data input configured to receive a dialog signal, a non-dialog signal, and metadata corresponding to the dialog signal and/or the non-dialog signal, and a second data input configured to receive a dialog balance preference; an audio signal output. The decoder device can include a processor circuit configured to, among other things, identify, using the metadata corresponding to the dialog signal and/or the non-dialog signal, a long-term dialog balance for an audio program comprising the dialog signal and the non-dialog signal, the long-term dialog balance indicating a dialog-to-non-dialog loudness relationship of the audio program, and determine a long-term gain or attenuation to apply to one of the dialog signal and the non-dialog signal of the audio program, the long-term gain or attenuation based on a difference between the identified long-term dialog balance for the audio program and the received dialog balance preference. In an example, the processor circuit can be further configured to provide an audio program signal at the audio signal output, the audio program signal including a combination of the one of the dialog signal and the non-dialog signal processed according to the determined long-term gain, and the other one of the dialog signal and the non-dialog signal. Aspect 14 can include or use, or can optionally be combined with the subject matter of Aspect 13, to optionally include the decoder device having a third input configured to receive an audio program type indication that corresponds to the dialog signal and/or the non-dialog signal, and the processor circuit is configured to determine the long-term gain or attenuation based on the audio program type indication and the difference between the identified long-term dialog balance for the audio program and the received dialog balance preference.

Aspect 15 can include or use, or can optionally be combined with the subject matter of one or any combination of Aspects 13 or 14 to optionally include or use the first data input configured to receive metadata corresponding to the dialog signal and the non-dialog signal. In Aspect 15, the processor circuit can be configured to identify respective long-term loudness characteristics of the dialog and non-dialog signals based on the received metadata corresponding to the dialog and non-dialog signals, and the processor circuit can be configured to identify the long-term dialog balance for the audio program based on a relationship between the long-term loudness characteristics of the dialog and non-dialog signals.

Aspect 16 can include or use, or can optionally be combined with the subject matter of one or any combination of Aspects 13 through 15 to optionally include or use the processor circuit being further configured to process the dialog signal according to a user-specified short-term dialog balance preference setting.

Aspect 17 can include, or can optionally be combined with the subject matter of one or any combination of Aspects 1 through 16 to include or use, subject matter (such as an apparatus, a method, a means for performing acts, or a machine readable medium including instructions that, when performed by the machine, that can cause the machine to perform acts), such as can include or use an audio signal processing system for adjusting a balance between dialog and non-dialog audio signals of an audio program. The system in Aspect 17 can include, among other things, a processor circuit configured to identify a long-term loudness metric for the dialog audio signal, the long-term dialog loudness metric representing a loudness characteristic of a dialog portion of the audio program, and identify a long-term loudness metric for the non-dialog audio signal, the long-term non-dialog loudness metric representing a loudness characteristic of a non-dialog portion of the audio program. When a loudness relationship between the long-term loudness metric for the dialog audio signal and the long-term loudness metric for the non-dialog audio signal differs from a desired loudness relationship by greater than a specified threshold amount, then the processor circuit can provide an audio program signal that includes a gain-adjusted version of at least one of the dialog signal and the non-dialog signal, wherein the specified threshold difference amount is determined using a received audio program-level dialog loudness preference.

Aspect 18 can include or use, or can optionally be combined with the subject matter of Aspect 17, to optionally include or use the processor circuit being configured to determine an amount of gain to apply to the dialog signal and/or to the non-dialog signal based on a received indication of a program type corresponding to the audio program.

Aspect 19 can include or use, or can optionally be combined with the subject matter of one or any combination of Aspects 17 or 18 to optionally include or use the processor circuit being configured to determine an amount of gain to apply to the dialog signal and/or to the non-dialog signal based on a user preference.

Aspect 20 can include or use, or can optionally be combined with the subject matter of one or any combination of Aspects 17 through 19 to optionally include or use the processor circuit being configured to determine an amount of gain to apply to the dialog signal and/or to the non-dialog signal based on a received indication of a playback environment or playback device.

Each of these non-limiting Aspects can stand on its own, or can be combined in various permutations or combinations with one or more of the other Aspects or examples provided herein.

Many variations of the concepts and examples discussed herein will be apparent to those skilled in the relevant arts. For example, depending on the embodiment, certain acts, events, or functions of any of the methods, processes, or algorithms described herein can be performed in a different sequence, can be added, merged, or omitted (such that not all described acts or events are necessary for the practice of the various methods, processes, or algorithms). Moreover, in some embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both, To illustrate this interchangeability of hardware and software, various components, blocks, modules, and process actions are, in some instances, described generally in terms of their functionality. Whether such functionality is implemented as hardware or software depends upon the particular application and design constraints imposed on the overall system. The described functionality can thus be implemented in varying ways for a particular application, but such implementation decisions should not be interpreted as causing a departure from the scope of this document.

The various illustrative logical blocks and modules described in connection with the embodiments disclosed herein can be implemented or performed by a machine, such as a general purpose processor circuit or circuitry, a processing device, a computing device having one or more processing devices, a digital signal processor (DSP), an application specific integrated circuit (AMC), afield programmable gate array (FPGA), or other programmable logic device, discrete gate or transistor logic, discrete hardware components, or any combination thereof designed to perform the functions described herein. A general purpose processor circuit or processing device can include a microprocessor. Additionally or alternatively, the processor circuit can include a controller, microcontroller, or state machine, combinations of the same, or the like. A processor circuit can also be implemented as a combination of computing devices, such as a combination of a DSP and a microprocessor, a plurality of microprocessors, one or more microprocessors in conjunction with a DSP core, or any other such configuration as appropriate to carry out the described signal processing tasks described herein.

Embodiments of the dialog control and enhancement system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments, the computing devices will include one or more processors, Each processor may be a specialized microprocessor, such as a digital signal processor (DSP), a very long instruction word (VLIW), or other micro-controller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in a massed, tangible, non-transitory computer-readable media that can be accessed by a computing device. The computer-readable media can include volatile and/or nonvolatile media, such as can be removable, non-removable, or some combination thereof. The computer-readable media can be used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Bluray discs (BD), digital versatile discs (DVDs), compact discs (CDs), floppy disks, tape drives, hard drives, optical drives, solid state memory devices, RAM memory, ROM memory, EPROM memory, EEPROM memory, flash memory, or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the dialog control and enhancement systems and methods described herein, or portions thereof, may be stored, received, transmitted, or read from any desired combination of computer or machine readable media or storage devices and communication media in the form of computer executable instructions or other data structures.

Embodiments of the dialog control and enhancement system and method described herein can be further described in the general context of computer-executable instructions, such as program modules, being executed by a computing device. Generally, program modules include routines, programs, objects, components, data structures, and so forth, which perform particular tasks or implement particular abstract data types. The embodiments described herein can also be practiced in distributed computing environments where tasks are performed by one or more remote processing devices, or within a cloud of one or more devices, that are linked through one or more communications networks. In a distributed computing environment, program modules can be located in both local and remote computer storage media including media storage devices. Still further, the aforementioned instructions may be implemented, in part or in whole, as hardware logic circuits, which may or may not include a processor.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Conditional language used herein, such as, among others "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features or methods or acts, it is to be understood that the subject matter defined in the appended claims is not necessarily limited to the specific features or acts described above. Rather, the specific features and acts described above are disclosed as example forms of implementing the claims.

What is claimed is:

1. A method for adjusting a loudness relationship between a dialog signal and a separate non-dialog signal in a particular audio program, the method comprising:
   receiving, using a processor circuit, a long-term dialog balance metric for the particular audio program, the long-term dialog balance metric indicating a dialog-to-non-dialog loudness relationship for the dialog and non-dialog signals of the particular audio program;
   receiving, using the processor circuit, an audio program-independent long-term dialog balance preference that indicates a user-specified preference for a loudness relationship for multiple different audio programs; and
   determining, using the processor circuit, a long-term gain or attenuation to apply to at least one of the dialog signal and the non-dialog signal of the particular audio program, the long-term gain or attenuation determined according to a difference between the received long-term dialog balance metric for the particular audio program and the received audio program-independent long-term dialog balance preference.

2. The method of claim 1, further comprising:
   determining the long-term gain to apply to the dialog signal of the particular audio program;
   applying the determined long-term gain to the dialog signal using the processor circuit to generate a gain-adjusted dialog signal; and
   rendering an audio output signal that includes a combination of the gain-adjusted dialog signal and the non-dialog signal.

3. The method of claim 1, further comprising:
   determining the long-term attenuation to apply to the dialog signal of the particular audio program;
   applying the determined long-term attenuation to the dialog signal using the processor circuit to generate an adjusted dialog signal; and
   rendering an audio output signal that includes a combination of the adjusted dialog signal and the non-dialog signal.

4. The method of claim 1, further comprising determining different respective long-term gain or attenuation amounts to apply to the dialog signal and the non-dialog signal.

5. The method of claim 1, further comprising:
   receiving, using the processor circuit, a long-temi dialog loudness metric corresponding to the dialog signal of the particular audio program;
   receiving a long-term non-dialog loudness metric corresponding to the non-dialog signal of the particular audio program; and
   providing, using the processor circuit, the long-term dialog balance metric based on a difference between the received dialog and non-dialog loudness metrics.

6. The method of claim 1, further comprising:
   receiving the dialog signal at the processor circuit, the dialog signal including first metadata with information about a global loudness of the dialog signal for the particular audio program;
   receiving the non-dialog signal at the processor circuit, the non-dialog signal including second metadata with information about a global loudness of the non-dialog signal for the particular audio program; and
   wherein the receiving the long-term dialog balance metric for the particular audio program includes determining, using the processor circuit, the long-term dialog balance metric based on the global loudness of the dialog signal and the global loudness of the non-dialog signal.

7. The method of claim 1, wherein the determining the long-term gain or attenuation includes determining a static gain or attenuation to apply to the dialog signal for a duration of the particular audio program.

8. The method of claim 1, wherein the receiving the audio program-independent long-term dialog balance preference includes receiving a genre-specific dialog loudness preference, the genre-specific dialog loudness preference corresponding to a genre of the particular audio program.

9. The method of claim 8, further comprising determining the genre of the particular audio program based on metadata recovered from the dialog signal and/or from the non-dialog signal.

10. The method of claim 1, wherein the receiving the audio program-independent long-term dialog balance preference includes receiving a playback device-specific dialog loudness preference, the playback device-specific dialog loudness preference corresponding to a playback device that is configured to play the particular audio program.

11. The method of claim 1, further comprising:
   receiving, using the processor circuit, a short-term dialog balance for each of multiple segments of the particular audio program, wherein each short-term dialog balance indicates a dialog-to-non-dialog loudness relationship for a specified segment;

receiving, using the processor circuit, a short-tetra dialog balance preference; and determining, using the processor circuit, a short-term gain or attenuation to apply to at least one of the dialog signal and the non-dialog signal, the short-term gain or attenuation determined according to a difference between the received short-term loudness balance for a specified one of the segments and the short-term dialog loudness preference.

12. The method of claim 11, further comprising:

providing a gain-adjusted dialog signal and/or a gain-adjusted non-dialog signal by (1) applying the determined long-term gain or attenuation to at least one of the dialog signal and the non-dialog signal, and (2) applying the determined short-term gain or attenuation to at least one of the dialog signal and the non-dialog signal; and rendering an audio output signal that includes the gain-adjusted dialog signal and/or the gain-adjusted non-dialog signal.

13. An audio signal processing system comprising:

a decoder device, including:

a first data input configured to receive a dialog signal, a non-dialog signal, and metadata corresponding to the dialog signal and/or the non-dialog signal;

a second data input configured to receive an audio program-independent long-term dialog balance preference indicative of a user-specified preferred loudness relationship between dialog and non-dialog components of an audio program;

an audio signal output; and a processor circuit configured to:

identify, using the metadata corresponding to the dialog signal and/or the non-dialog signal, a long-term dialog balance metric for a particular audio program comprising the dialog signal and the non-dialog signal, the long-term dialog balance metric indicating a dialog-to-non-dialog loudness relationship for the dialog and non-dialog signals of the particular audio program;

determine a long-term gain or attenuation to apply to one of the dialog signal and the non-dialog signal of the particular audio program, the long-term gain or attenuation based on a difference between the identified long-term dialog balance metric for the particular audio program and the received audio program-independent long-term dialog balance preference; and provide an audio program signal at the audio signal output, the audio program signal including a combination of the one of the dialog signal and the non-dialog signal processed according to the determined long-term gain or attenuation, and the other one of the dialog signal and the non-dialog signal.

14. The system of claim 13, wherein the decoder device includes a third input configured to receive an audio program type indication that corresponds to the dialog signal and/or the non-dialog signal; and wherein the processor circuit is configured to determine the long-term gain or attenuation based on the audio program type indication and the difference between the identified long-term dialog balance for the particular audio program and the received audio program-independent long-term dialog balance preference.

15. The system of claim 13, wherein the first data input is configured to receive metadata corresponding to the dialog signal and the non-dialog signal;

wherein the processor circuit is configured to identify respective long-term loudness characteristics of the dialog and non-dialog signals based on the received metadata corresponding to the dialog and non-dialog signals; and wherein the processor circuit is configured to identify the long-term dialog balance for the particular audio program based on a relationship between the long-term loudness characteristics of the dialog and non-dialog signals.

16. The system of claim 13, wherein the processor circuit is further configured to process the dialog signal according to a user-specified short-term dialog balance preference setting.

17. An audio signal processing system for adjusting a balance between separate dialog and non-dialog audio signals that comprise portions of a particular audio program, the system comprising:

a processor circuit configured to:

identify a long-term loudness metric for the dialog audio signal, the long-term dialog loudness metric representing a loudness characteristic of a dialog portion of the particular audio program;

identify a long-term loudness metric for the non-dialog audio signal, the long-term non-dialog loudness metric representing a loudness characteristic of a non-dialog portion of the particular audio program; and when a loudness relationship between the long-term loudness metric for the dialog audio signal and the long-term loudness metric for the non-dialog audio signal differs from a desired loudness relationship by greater than a specified threshold amount, provide an audio program signal that includes a gain-adjusted version of at least one of the dialog signal and the non-dialog signal, wherein the specified threshold difference amount is deter mined using a received audio program-independent long-term dialog loudness preference.

18. The system of claim 17, wherein the processor circuit is configured to determine an amount of gain to apply to the dialog signal and/or to the non-dialog signal based on a received indication of a program type corresponding to the particular audio program.

19. The system of claim 17, wherein the processor circuit is configured to determine an amount of gain to apply to the dialog signal and/or to the non-dialog signal based on a user preference corresponding to the audio program-independent long-term dialog loudness preference.

20. The system of claim 17, wherein the processor circuit is configured to determine an amount of gain to apply to the dialog signal and/or to the non-dialog signal based on a received indication of a playback environment or playback device.

* * * * *

UNITED STATES PATENT AND TRADEMARK OFFICE
CERTIFICATE OF CORRECTION

PATENT NO. : 10,251,016 B2
APPLICATION NO. : 15/336382
DATED : April 2, 2019
INVENTOR(S) : Jot et al.

It is certified that error appears in the above-identified patent and that said Letters Patent is hereby corrected as shown below:

In the Claims

In Column 22, Line 20, in Claim 5, delete "long-temi" and insert --long-term-- therefor In Column 23, Line 1, in Claim 11, delete "short-tetra" and insert --short-term-- therefor In Column 24, Line 43, in Claim 17, delete "deter mined" and insert --determined-- therefor Signed and Sealed this
Twenty-eighth Day of April, 2020

Andrei Iancu
*Director of the United States Patent and Trademark Office*